United States Patent
Chu

(10) Patent No.: US 8,494,171 B2
(45) Date of Patent: Jul. 23, 2013

(54) ENERGY SAVING PWM SOUND DEVICE

(76) Inventor: Jack Chu, Kowloon (HK)

( * ) Notice: Subject to any disclaimer, the term of this patent is extended or adjusted under 35 U.S.C. 154(b) by 255 days.

(21) Appl. No.: 12/806,714

(22) Filed: Aug. 18, 2010

(65) Prior Publication Data

US 2012/0045075 A1 Feb. 23, 2012

(51) Int. Cl.
*H04R 3/007* (2006.01)
*H04R 3/04* (2006.01)
*H04R 5/04* (2006.01)
*H03F 3/68* (2006.01)
*H04R 3/00* (2006.01)

(52) U.S. Cl.
CPC .... *H04R 3/007* (2013.01); *H04R 3/04* (2013.01); *H04R 5/04* (2013.01); *H03F 3/68* (2013.01)
USPC .................. 381/55; 381/98; 381/28; 381/120

(58) Field of Classification Search
USPC ............. 381/55, 56, 58, 77, 28, 120, 98
See application file for complete search history.

(56) References Cited

U.S. PATENT DOCUMENTS

2008/0144862 A1* 6/2008 Xu ................................ 381/120

* cited by examiner

*Primary Examiner* — Duc Nguyen
*Assistant Examiner* — George Monikang
(74) *Attorney, Agent, or Firm* — Raymond Y. Chan; David and Raymond Patent Firm

(57) ABSTRACT

An energy saving PWM sound device forms a frequency-dependent impedance device implemented on the PWM output of the voice-ICs in series to lower the power consumption and to enhance sound quality of the voice-IC products. The device includes a hollow core body and an elongated conductive element. The core body has a top rim, a bottom rim, and two side rims to define a through channel therewithin. The conductive element winds around the top rim of the core body, wherein two ends of the conductive element are adapted for connecting with the PWM output, such that when the conductive element is electrically conducted, the core body acts as an inductor at lower frequency and a frequency-dependent resistor in series with the inductor at higher frequency for blocking most of PWM carrier frequency so as to reduce the power consumption of the voice-ICs product.

20 Claims, 7 Drawing Sheets

ENERGY SAVING PWM SOUND DEVICE

BACKGROUND OF THE PRESENT INVENTION

1. Field of Invention

The present invention relates to a PWM sound device, and more particularly to energy saving PWM sound device behaves like an inductor to block most of the PWM frequency and its harmonics to the speaker such that the power consumption and EMI is significantly reduced.

2. Description of Related Arts

As the fast developing technology in electronics and semiconductors, electronics devices are work more efficient. Energy saving are the obvious trend during the development of almost every electronic product. Especially in fields such as voice-IC products, equipments must adapt higher audio quality and low energy consumption. The requirement of being better sound quality but environmental energy saving can never be stopped.

But there is a bottleneck for audio signal transportation. Electromagnetic interference (EMI) always reduces the sound quality of sound products. Traditionally voice-ICs contain PWM (Pulse-Width Modulation) direct drive output, which the speaker is connected to the PWM output. The output signal contains three parts: an audio signal, PWM carriers signal, and the aliasing noise (due to low sampling rate of audio signal), wherein this carriers frequency is normally few 10 kHz. Accordingly, since there is an inference between the audio signal and the electromagnetic force, the sound quality of the voice-ICs is dramatically reduced.

Moreover, in voice-IC products, power consumption is always an important concern. Traditionally such power consumption is measured by current drain of the power source (battery). Accordingly, normally an ammeter is connected in series of the power source. When the voice-IC is playing, such ammeter can measure the current drain of the voice-IC. But such measurement method has a big disadvantage. Most of the voice-IC outputs are under PWM format. When the voice-IC is under playing, current will be consumed only when the output is in high-level instant. No current will be consumed when the output is in low-level instant.

In voice-IC, the carrier frequency is normally from 20 kHz-30 kHz (30 us-50 us in period). Under such high frequency, the measured current consumption will be shown under high frequency frustration. No matter analog or digital ammeter is used, the reading will still under frustration and it is so difficult to get an accurate result. Moreover, PWM carriers signal carrier dissipation further leads to power waste. Accordingly, the audio signal up to 4 kHz is the mainly playback sound which is concerned. The signal of carrier frequency (which is not auditable) and the aliasing noise (unwanted "metallic" sound) are not useful, and even worse to the playback sound. Such signals also consume power as well.

SUMMARY OF THE PRESENT INVENTION

A main object of the present invention is to provide an energy saving PWM sound device, which behaves like an inductor to block most of the PWM frequency and its harmonics to the speaker. Therefore, the power consumption from the PWM carrier dissipation and EMI is significantly reduced.

Another object of the present invention is to provide an energy saving PWM sound device, which is a frequency-dependent impedance device implemented on the PWM output of the voice-ICs in series such that the voice-ICs products can have lower active power consumption and better sound quality.

Another object of the present invention is to provide an energy saving PWM sound device, wherein the structural configuration of the frequency-dependent impedance device is simple by overlapping two impedance members with each other and winding a conductive element at the impedance members, so as to minimize the manufacturing cost of the present invention.

Another object of the present invention is to provide an energy saving PWM sound device, wherein the impedance members are identical in shape and size and are made of a rectangular metal piece geometrically cut into two impedance members without wasting any unnecessary material of the metal piece during manufacturing process. Therefore, the present invention can be mass produced while being cost effective.

Another object of the present invention is to provide an energy saving PWM sound device, wherein no glue is needed to couple the impedance members since they will well fit inside the framework.

Another object of the present invention is to provide an energy saving PWM sound device, which does not require to alter the original structural design of the PWM output of a voice-ICs product, so as to minimize the manufacturing cost of the PWM output of a voice-ICs product incorporating with the energy saving PWM sound device.

Another object of the present invention is to provide an energy saving PWM sound device, which can be quickly coupled with the PCB as a component thereof.

Another object of the present invention is to provide an energy saving PWM sound device, wherein no expensive or complicated structure is required to employ in the present invention in order to achieve the above mentioned objects. Therefore, the present invention successfully provides an economic and efficient solution for providing an energy friendly device for the PWM output of the voice-ICs product to reduce the power consumption thereof and for reducing the EMI (Electromagnetic interference) to enhance the sound quality of the voice-ICs product.

Accordingly, in order to accomplish the above object, the present invention provides an energy saving sound device for a PWM output of a voice-IC product, which comprises a hollow core body and an elongated conductive element.

The hollow core body has a top rim, a bottom rim, and two side rims to define a through channel therewithin, wherein the hollow core comprises two or more planer impedance members. Each of the impedance members has a base portion and first and second extension portions, spacedly and parallely extended from the base portion to form a C-shaped configuration. Accordingly, the core body is formed by stacking the impedance members are overlapped side-by-side at a position that the first extension portions of the impedance members are overlapped to form the top rim, the second extension portions of the impedance members are overlapped to form the bottom rim, and the base portions are the side rims respectively.

The conductive element is winding around the top rim of the core body through the through channel to retain the impedance members in position, wherein two ends of the conductive element are adapted for connecting with the PWM output, such that when the conductive element is electrically conducted, the core body acts as an inductor at lower frequency and a frequency-dependent resistor in series with the inductor at higher frequency for blocking most of PWM carrier frequency so as to reduce a power consumption of the voice-ICs product.

These and other objectives, features, and advantages of the present invention will become apparent from the following detailed description, the accompanying drawings, and the appended claims.

DETAILED DESCRIPTION OF THE PREFERRED EMBODIMENT

Figure 1:
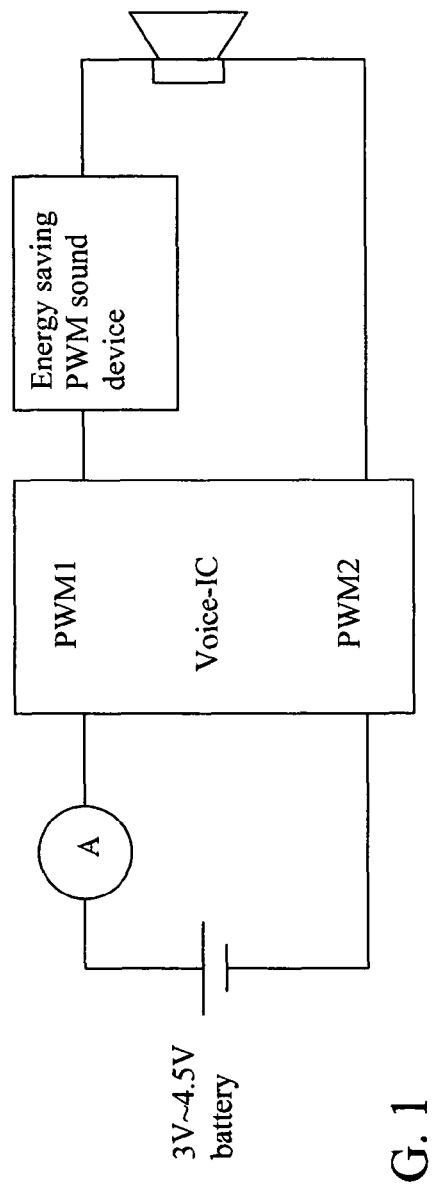
FIG. 1 illustrates an energy saving sound device for a PWM output of a voice-ICs product according to a preferred embodiment of the present invention.
Figure 2:
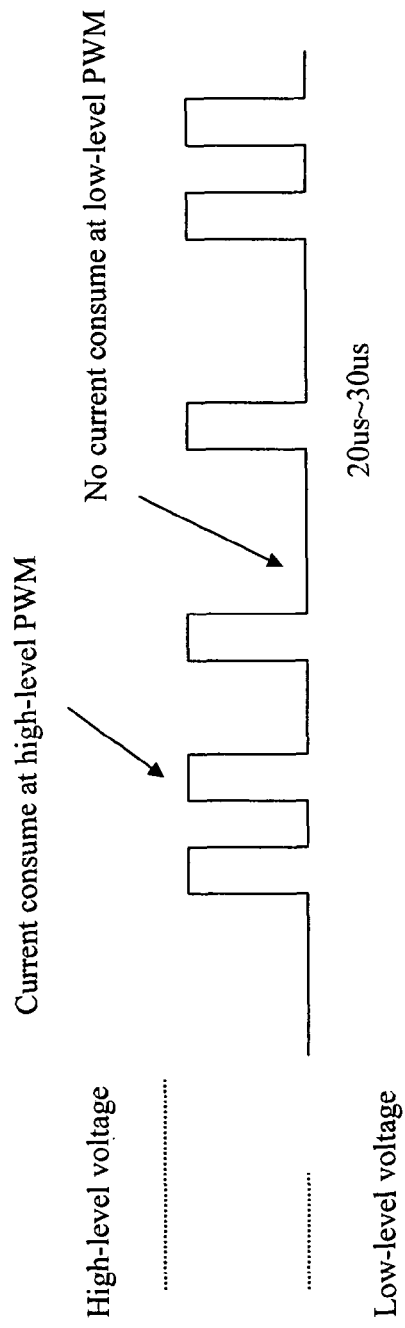
FIG. 2 is a diagram illustrating PWM output of Voice-IC through the power consumption measurement.

Referring to FIGS. 1 to 5 of the drawing, an energy saving PWM sound device for a PWM output of a voice-IC product according to a preferred embodiment of the present invention is illustrated, wherein the energy saving PWM sound device is a frequency-dependent impedance device implemented on the PWM output of the voice-IC product in series such that the voice-IC product can have lower active power consumption and better sound quality.

Accordingly, the energy saving PWM sound device behaves like an inductor at low frequency (below 2 kHz) and a frequency-dependent resistor in series with the inductor at high frequency. For example, the energy saving PWM sound device can have reactive impedance equals to 5Ω±10% at 4 kHz (with sine wave test) and DC resistance equals to 1.5Ω only. Base on such properties of energy saving PWM sound device, it can block most of the PWM carrier frequency and its harmonics to the speaker. Therefore, the power consumption (from PWM carrier dissipation) and EMI is significantly reduced.

Also, the aliasing noise can be reduced due to high impedance but only have little affect to the playback sound frequency at the same time. Therefore, the power consumption of the PWM carrier can be reduced since the energy saving PWM sound device acts as a high impedance device at the carrier frequency bandwidth. The aliasing noise can be reduced since the energy saving PWM sound device acts as a high impedance device, such that the unwanted metallic sound is reduced as well. With the energy saving PWM sound device, the total power dissipation of voice-IC can be reduced and the sound quality can be improved at the same time.

Figure 3:
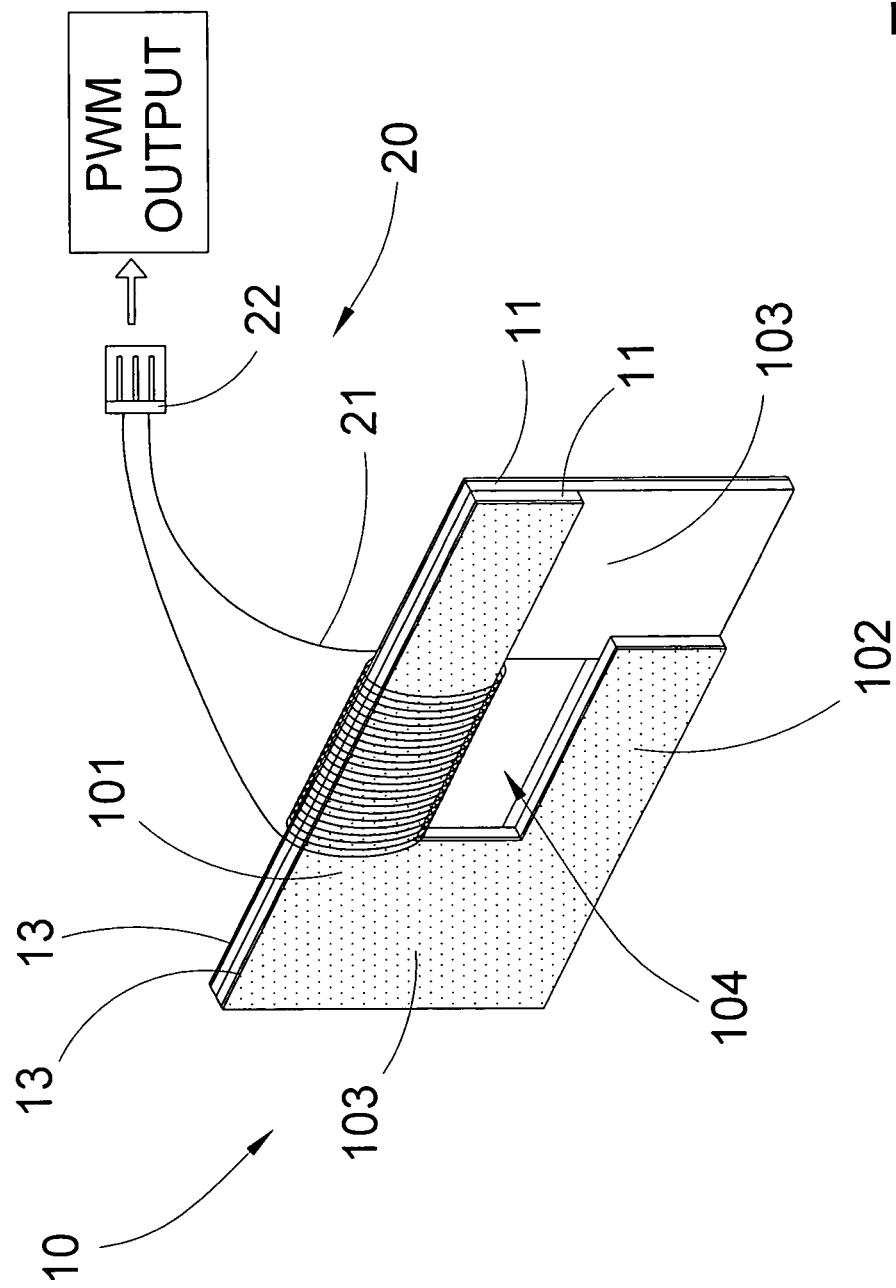
FIG. 3 is a perspective view of the energy saving sound device for a PWM output of a voice-IC product according to the above preferred embodiment of the present invention.
Figure 4:
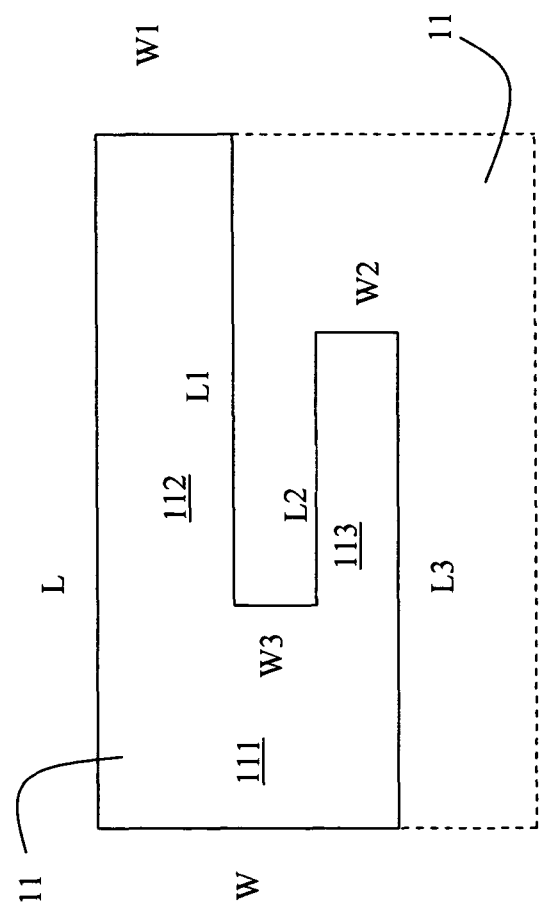
FIG. 4 is schematic view of an impedance member of the energy saving sound device according to the above preferred embodiment of the present invention, illustrating the plane geometry of the impedance member.
Figure 5:
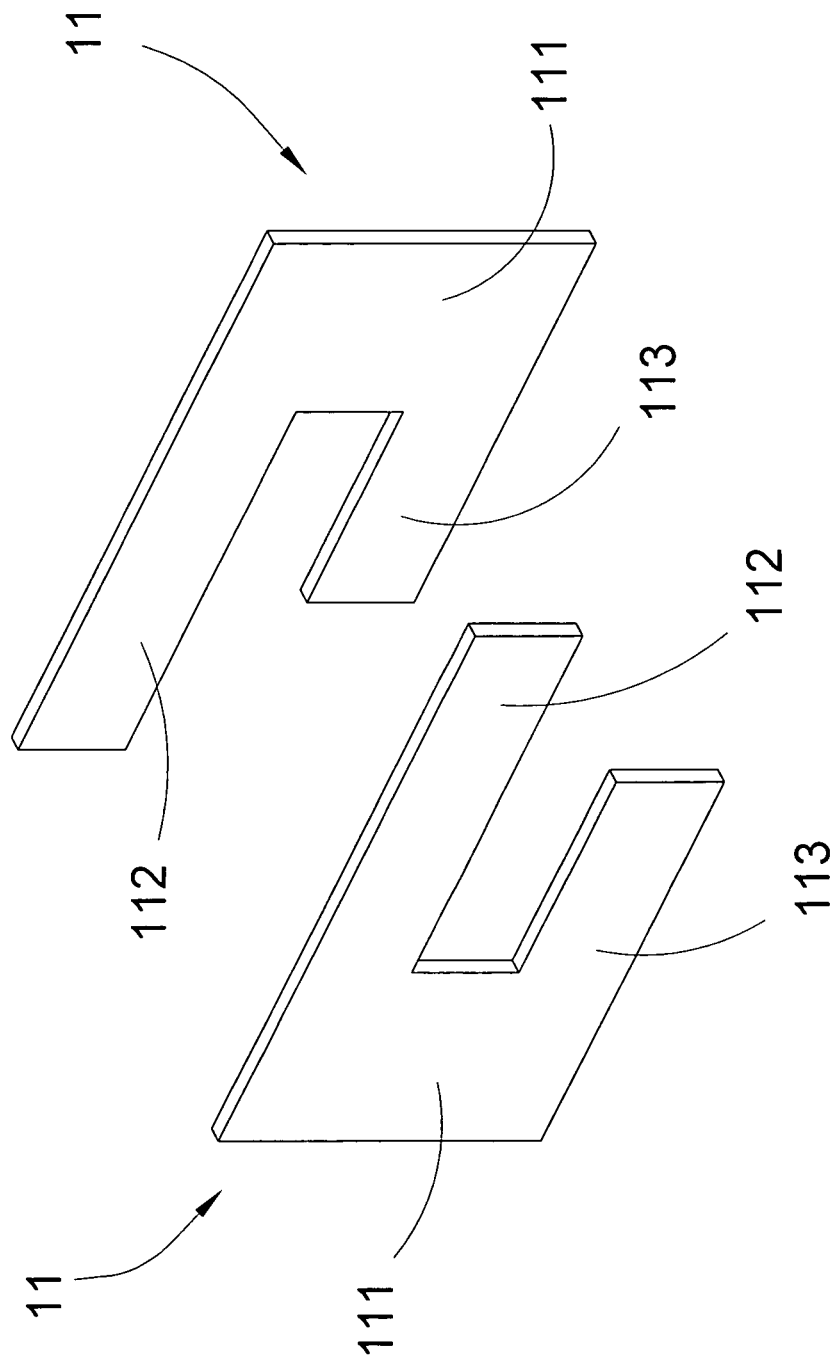
FIG. 5 is an exploded perspective view of the impedance members of the energy saving sound device according to the above preferred embodiment of the present invention.

As shown in FIGS. 3 to 5, the energy saving PWM sound device comprises a hollow body 10 and an elongated conductive element 20 to operatively link with the PWM output of a voice-ICs product.

The hollow core body 10 has a top rim 101, a bottom rim 102, and two side rims 103 to define a through channel 104 therewithin, wherein the hollow core 10 comprises two or more planer impedance members 11. Each of the impedance members 11 has a base portion 111 and first and second extension portions 112, 113, spacedly and parallely extended from the base portion 111 to form a C-shaped configuration. Accordingly, the core body 10 is formed by stacking the impedance members 11 are overlapped side-by-side at a position that the first extension portions 112 of the impedance members 11 are overlapped to form the top rim 101, the second extension portions 113 of the impedance members 11 are overlapped to form the bottom rim 102, and the base portions 111 of the impedance members 11 are formed the side rims 103 respectively.

The conductive element 20 is winding around the top rim 101 of the core body 10 through the through channel 104 to retain the impedance members 11 in position, wherein two ends of the conductive element 20 are adapted for connecting with the PWM output. Therefore, when the conductive element 20 is electrically conducted, the core body 10 acts as an inductor at lower frequency and a frequency-dependent resistor in series with the inductor at higher frequency for blocking most of PWM carrier frequency so as to reduce a power consumption of the voice-ICs product.

Therefore, with the above mentioned configuration, the voice-IC products can have lower active power consumption and better sound quality. This is implemented by connecting the Frequency-Dependent Impedance Device of the present invention on the PWM output of voice-IC product in series.

The core body 10 further comprises two insulation layers 13 provides at two outer sides of the core body 10 at the two outermost impedance members 11 at the top rims 11 thereof.

The first extension portion 112 of each of the impedance members 11 is longer than the second extension portion 113 of the respective impedance member 11. In addition, the first extension portion 112 of each of the impedance members 11 is wider than the second extension portion 113 of the respective impedance member 11.

Particularly, the impedance member 11 has a geometrical dimension as shown in FIG. 4. For example, the geometrical configuration of the impedance member 11 is that the width W of the impedance member 11, i.e. the width of the base portion 111 of the impedance member 11, is 5.5 mm. The length L of the impedance member 11 is 15 mm. The width W1 of the first extension portion 112 of the impedance member 11 is 2.5 mm. The length L1 of the first extension portion 112 of the impedance member 11 from the base portion 111 is 10 mm. The width W2 of the second extension portion 113 of the impedance member 11 is 1.5 mm. The gap W3 between the first and second extension portions 112, 113 of the impedance member 11, i.e. the height of the through channel 104, is 1.5 mm. The total length L3 of the base portion 111 and the second extension portion 113 of the impedance member 11 is 10.5 mm. It is worth mentioning that the size of the impedance member can be selectively adjusted in responsive to the ratio of L, L1, L2, L3, W, W1, W2, and W3.

As shown in FIG. 4, the impedance members 11 are identical in shape and size and are preferably made of silicon steel. Preferably, each of the impedance members 11 has a thickness of 0.35 mm. As shown in FIG. 5, a rectangular metal piece geometrically cut into two of the impedance members 11. Therefore, the geometry design of the present invention is specially designed for low-cost mass production. It is worth mentioning that two or more impedance members 11 are overlapped and formed an alloy core of the energy saving PWM sound device, wherein such design can provide a mass production which do not waste any material during cutting.

As shown in FIG. 3, the conductive element 20 comprises an enameled wire 21 having a DC resistance not larger than 1.5Ω, and a connector 22 is provided at the ends of the wire 21 to connect with the PWM output.

In addition, the conductive element 20 is winded around the top rim 101 of the core body 10 at least 95 turns thereat, wherein the size of the conductive element 20 is AWG32 (American wire gauge). Therefore, no glue or other attaching element is needed to couple the impedance members 11 with each other. Preferably, the thickness of the enameled wire 21 used is suggested as thin as possible, in which the DC resistance thereof should be kept not larger than 1.5Ω.

Figure 6:
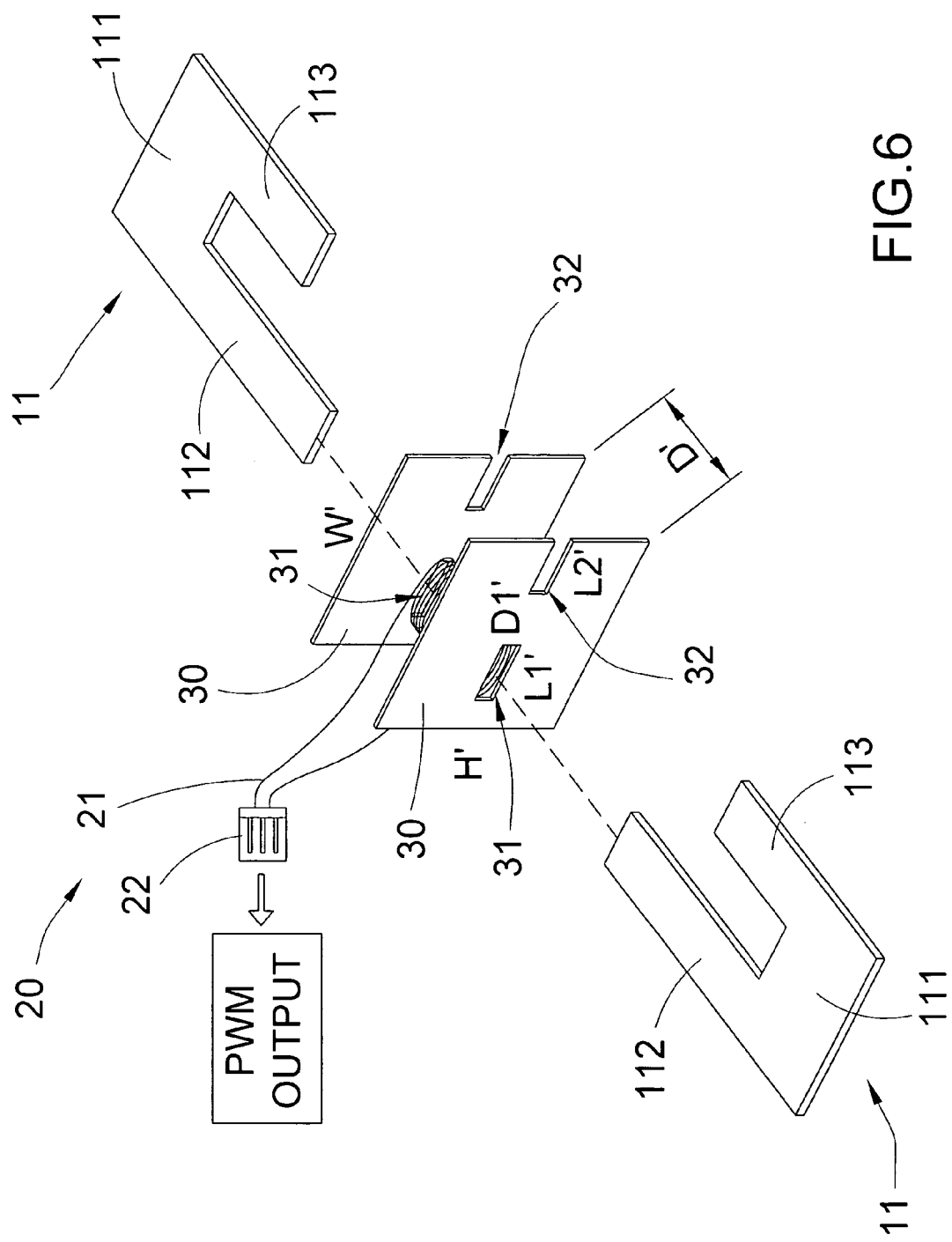
FIG. 6 illustrates a plastic frame design of the energy saving sound device according to the above preferred embodiment of the present invention.

As shown in FIG. 6, the energy saving PWM sound device further comprises two side frames 30 for perpendicularly holding the core body 10 in position, wherein each of the side frames 30 has a through slot 31 for the first extension portion 112 of the impedance member 11 perpendicularly passing therethrough and an opened slot 32 extended from a peripheral edge for the second extension portion 113 of the impedance member 11 passing through such that the side frames are perpendicular to the core body 10 and are parallel with each other. Preferably, both the through slot 31 and the opened slot 32 have the rectangular shape and are aligned with each other on the respective side frame 30.

Accordingly, each of the side frames 30 is made of plastic to form a plastic frame of the energy saving PWM sound device. As shown in FIG. 6, only two impedance members 11 are needed to incorporate with the side frames 30 to form the framework of the energy saving PWM sound device. Each of the impedance members 11 is slidably mounted to the respective side frame 30 from an outer side thereof. In other words, when the first and second extension portions 112, 113 of the impedance member 11 are slidably passing through the through slot 31 and the opened slot 32 of the side frame 30 respectively, the base portion 111 of the impedance member 11 is located at the outer side of the respective side frame 30. Then, when the first extension portions 112 of the impedance members 11 are overlapped to form the top rim 101 and the second extension portions 113 of the impedance members 11 are overlapped to form the bottom rim 102, the conductive element 20 can wind at the top rim 101 of the core body 10 through the through channel 104 to retain the impedance members 11 perpendicularly between the side frames 30. It is worth mentioning that no glue or other attaching element is needed to couple the impedance members 11 well fitting with the side frames 30. Therefore, the entire energy saving PWM sound device can be quickly and simply coupled at the PCB as a component thereof.

Particularly, each of the side frames 30 has a geometrical dimension as shown in FIG. 6. For example, the geometrical configuration of the side frame 30 is that the height H' of the side frame 30 is 7.5 mm. The width W' of the side frame 30 is 9 mm. The length L1' of the through slot 31 is 2.6 mm. The length L2' of the opened slot 32 is 2.5 mm. The width W1' of the through slot 31, which is the same as the width of the opened slot 32, is 0.7 mm. The distance D1' between two adjacent edges of the through slot 31 and the opened slot 32 is 2.5 mm. The distance D' between the side frames 30 is 5 mm.

Figure 7:
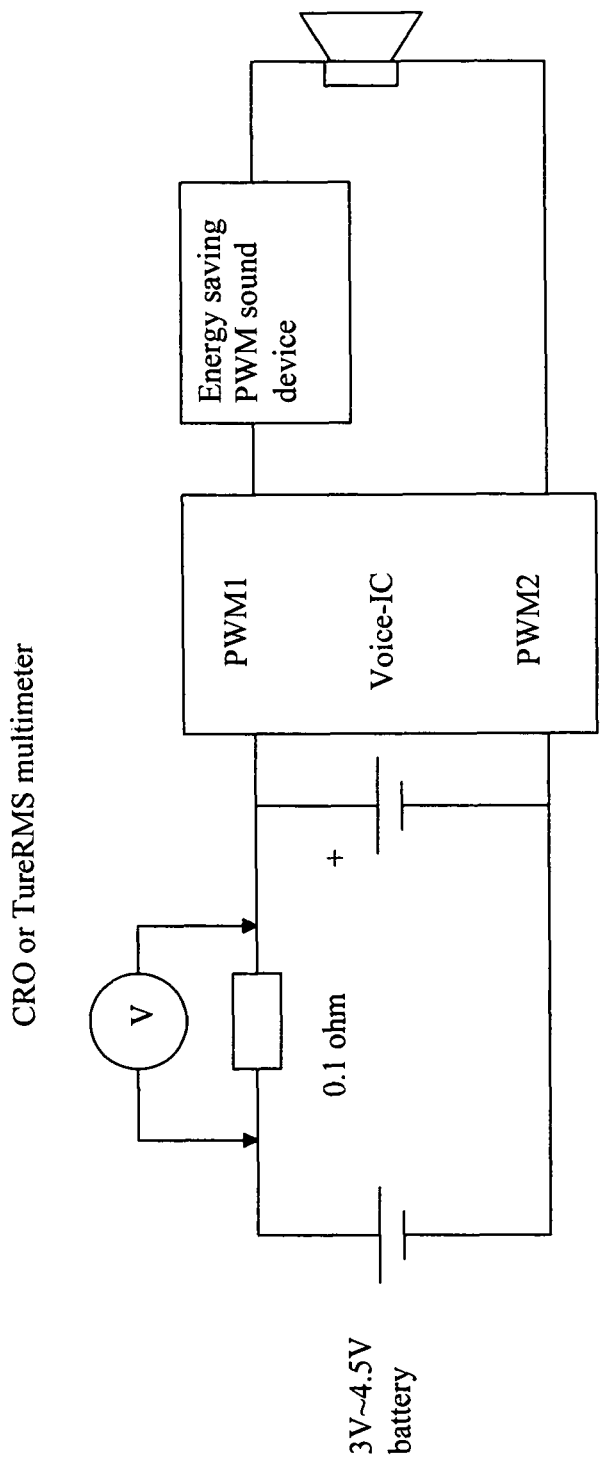
FIG. 7 illustrates the power consumption measurement with CRO/TrusRMS to measure the voltage change at the power source when the PWM output of a voice-IC product incorporating with the energy saving sound device.

In order to provide more accurate measurement, a different approach can be used to measure the power consumption of the PWM output of a voice-ICs product incorporating with the energy saving PWM sound device of the present invention. Instead of monitor the current drain directly, it can be measure the voltage change at the power source by connecting a 0.1 ohm resistor in series (this can be done by connecting 5 to 6 1.2 ohm resistors in parallel since 0.1 ohm resistor is not commonly found). Smaller the resistance will provide less voltage drop of the power source so that minimize the defect of the measured result. The voltage measurement can be made by CRO or TrueRMS multimeter to calculate the root-means-square value of the voltage. The connection configuration of the PWM output of a voice-ICs product incorporating with the energy saving PWM sound device for power consumption measurement with CRO/TrusRMS is shown in FIG. 7.

By CRO/TrusRMS multimeter, the voltage change can be captured by the screen clearly. The voltage RMS value can be easily calculated so that the current consumption ($I_{RMS}=V_{RMS}/0.1$). The capacitor is used to further smoothing the voltage change so that the calculated value can be more accurate.

Figure 8:
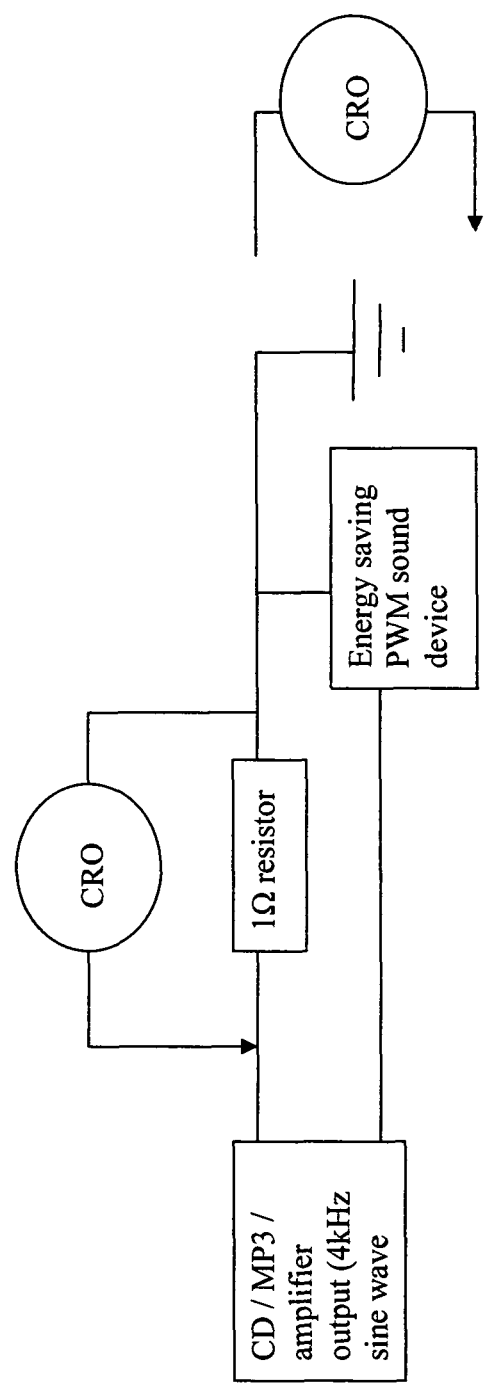
FIG. 8 illustrates a testing method of the energy saving sound device according to the above preferred embodiment of the present invention.

According to the preferred embodiment, the reactive impedance of the energy saving PWM sound device of the present invention, under 4 kHz sine wave, is 5Ω±10%. The number of turns and AWG are designed based on this factor. The testing method of the energy saving PWM sound device can be done as shown in FIG. 8.

The calibration can be done by: $(V_{P-P(CH-2)})/(V_{P-P(CH-1)})=5$

It is worth mentioning that the normal RCL meter or AC voltage measurement from multimeter cannot be used since the sine signal generated by the meter is not suitable.

One skilled in the art will understand that the embodiment of the present invention on as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An energy saving PWM sound device for a PWM output of a voice-ICs product, comprising:

a hollow core body having a top rim, a bottom rim, and two side rims to define a through channel therewithin, wherein said hollow core comprises two or more planer impedance members, each having a base portion and first and second extension portions spacedly and parallely extended from said base portion to form a C-shaped configuration, wherein said impedance members are stacked together to form said core body that said first extension portions of said impedance members are overlapped to form said top rim, said second extension portions of said impedance members are overlapped to form said bottom rim, and said base portions are said side rims respectively; and an elongated conductive element winding around said top rim of said core body through said through channel to retain said impedance members in position, wherein two ends of said conductive element are adapted for connecting with said PWM output, such that when said conductive element is electrically conducted, said core body acts as an inductor at lower frequency and a frequency-dependent resistor in series with said inductor at higher frequency for blocking most of PWM carrier frequency so as to reduce a power consumption of the voice-ICs product.

2. The energy saving PWM sound device, as recited in claim 1, wherein said impedance members are identical.

3. The energy saving PWM sound device, as recited in claim 1, wherein said impedance members are made of silicon steel.

4. The energy saving PWM sound device, as recited in claim 2, wherein said impedance members are made of silicon steel.

5. The energy saving PWM sound device, as recited in claim 1, wherein each of said impedance members has a thickness of 0.35 mm.

6. The energy saving PWM sound device, as recited in claim 4, wherein each of said impedance members has a thickness of 0.35 mm.

7. The energy saving PWM sound device, as recited in claim 1, wherein said conductive element is an enameled wire having a DC resistance not larger than 1.5. OMEGA.

8. The energy saving PWM sound device, as recited in claim 6, wherein said conductive element is an enameled wire having a DC resistance not larger than 1.5. OMEGA.

9. The energy saving PWM sound device, as recited in claim 7, wherein said conductive element is winded around said top rim of said core body at least 95 turns thereat.

10. The energy saving PWM sound device, as recited in claim 8, wherein said conductive element is winded around said top rim of said core body at least 95 turns thereat.

11. The energy saving PWM sound device, as recited in claim 1, wherein said first extension portion of each of said impedance members is longer than said second extension portion of said respective impedance member.

12. The energy saving PWM sound device, as recited in claim 10, wherein said first extension portion of each of said impedance members is longer than said second extension portion of said respective impedance member.

13. The energy saving PWM sound device, as recited in claim 11, wherein said first extension portion of each of said impedance members is wider than said second extension portion of said respective impedance member.

14. The energy saving PWM sound device, as recited in claim 12, wherein said first extension portion of each of said impedance members is wider than said second extension portion of said respective impedance member.

15. The energy saving PWM sound device, as recited in claim 1, wherein impedance members are made of a rectangular metal piece geometrically cut into two of said impedance members.

16. The energy saving PWM sound device, as recited in claim 14, wherein impedance members are made of a rectangular metal piece geometrically cut into two of said impedance members.

17. The energy saving PWM sound device, as recited in claim 1, wherein said core body further comprises two insulation layers provides at two outer sides of said core body at said two outermost impedance members at said top rims thereof.

18. The energy saving PWM sound device, as recited in claim 16, wherein said core body further comprises two insulation layers provides at two outer sides of said core body at said two outermost impedance members at said top rims thereof.

19. The energy saving PWM sound device, as recited in claim 1, further comprising two side frames for perpendicularly holding said core body in position, wherein each of said side frames has a through slot for said first extension portion of said impedance member perpendicularly passing therethrough and an opened slot extended from a peripheral edge for said second extension portion of said impedance member passing through such that said side frames are perpendicular to said core body and are parallel with each other.

20. The energy saving PWM sound device, as recited in claim 18, further comprising two side frames for perpendicularly holding said core body in position, wherein each of said side frames has a through slot for said first extension portions of said impedance members perpendicularly passing therethrough and an opened slot extended from a peripheral edge for said second extension portions of said impedance members passing through such that said side frames are perpendicular to said core body and are parallel with each other.

* * * * *